United States Patent
Yasunori

(10) Patent No.: US 10,766,441 B2
(45) Date of Patent: Sep. 8, 2020

(54) CHARGING RATE MONITORING APPARATUS FOR IN-VEHICLE POWER SUPPLY, AND IN-VEHICLE POWER SUPPLY SYSTEM

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Hiromichi Yasunori, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 169 days.

(21) Appl. No.: 16/075,391

(22) PCT Filed: Feb. 28, 2017

(86) PCT No.: PCT/JP2017/007712
§ 371 (c)(1),
(2) Date: Aug. 3, 2018

(87) PCT Pub. No.: WO2017/154661
PCT Pub. Date: Sep. 14, 2017

(65) Prior Publication Data
US 2019/0047494 A1 Feb. 14, 2019

(30) Foreign Application Priority Data

Mar. 8, 2016 (JP) .................................. 2016-044381

(51) Int. Cl.
*B60R 16/03* (2006.01)
*H02J 7/00* (2006.01)
(Continued)

(52) U.S. Cl.
CPC .............. *B60R 16/03* (2013.01); *B60R 16/04* (2013.01); *G01R 31/36* (2013.01);
(Continued)

(58) Field of Classification Search
CPC ........... B60R 16/03; H02J 7/00; B60W 20/00; G06F 19/00; F02B 63/04
See application file for complete search history.

(56) References Cited

U.S. PATENT DOCUMENTS

2010/0100265 A1* 4/2010 Kato ...................... B60K 6/445
701/22
2012/0041630 A1* 2/2012 Yamamoto ............ B60W 20/40
701/22
(Continued)

FOREIGN PATENT DOCUMENTS

JP  H05-328529 A  12/1993
JP  H09-252546 A  9/1997
(Continued)

OTHER PUBLICATIONS

May 16, 2017 Search Report issued in International Patent Application No. PCT/JP2017/007712.

*Primary Examiner* — Yuri Kan
(74) *Attorney, Agent, or Firm* — Oliff PLC

(57) ABSTRACT

A charging rate monitoring apparatus for in-vehicle power supply configured to monitor charging rates of both a first power storage device and a second power storage device that supply power to a load via a power line, the apparatus including: a first switch connected between the power line and the first power storage device; a second switch con-
(Continued)

nected between the power line and the second power storage device; a first monitoring circuit configured to output on/off signals to the first switch; and a second monitoring circuit configured to output on/off signals to the second switch.

11 Claims, 7 Drawing Sheets

(51) Int. Cl.
| | | |
|---|---|---|
| *B60W 20/00* | (2016.01) | |
| *G06F 19/00* | (2018.01) | |
| *F02B 63/04* | (2006.01) | |
| *G01R 31/36* | (2020.01) | |
| *H01M 10/44* | (2006.01) | |
| *H01M 10/48* | (2006.01) | |
| *G01R 31/3828* | (2019.01) | |
| *G01R 31/3835* | (2019.01) | |
| *B60R 16/04* | (2006.01) | |

(52) U.S. Cl.
CPC ..... *G01R 31/3828* (2019.01); *G01R 31/3835* (2019.01); *H01M 10/44* (2013.01); *H01M 10/48* (2013.01); *H02J 7/00* (2013.01); *H02J 7/007* (2013.01)

(56) References Cited

U.S. PATENT DOCUMENTS

| | | | |
|---|---|---|---|
| 2012/0161713 A1* | 6/2012 | Kim | B60L 53/14 |
| | | | 320/134 |
| 2014/0261250 A1* | 9/2014 | Katayama | B60L 50/10 |
| | | | 123/2 |

FOREIGN PATENT DOCUMENTS

| | | |
|---|---|---|
| JP | 2007-276654 A | 10/2007 |
| JP | 2013-183561 A | 9/2013 |
| JP | 2014-036458 A | 2/2014 |
| JP | 2014-180151 A | 9/2014 |

* cited by examiner

CHARGING RATE MONITORING APPARATUS FOR IN-VEHICLE POWER SUPPLY, AND IN-VEHICLE POWER SUPPLY SYSTEM

This application is the U.S. National Phase of PCT/JP2017/007712 filed Feb. 28, 2017, which claims priority from JP 2016-044381 filed Mar. 8, 2016, the entire disclosure of which is incorporated herein by reference.

BACKGROUND

This disclosure relates to a charging rate monitoring apparatus for in-vehicle power supply, and an in-vehicle power supply system.

JP 2011-234479A discloses a vehicle provided with a lead storage battery and a lithium ion storage battery. The lead storage battery is directly connected to an alternator, a starter, and a first electrical load. Also, this lead storage battery is connected to a second electrical load via a bidirectional semiconductor switch. The lithium ion storage battery is connected to the second electrical load via a Li (lithium) storage battery relay.

In JP 2011-234479A, the charging rates of the lead storage battery and the lithium ion storage battery are calculated based on a current flowing through these batteries, and the semiconductor switch and the Li storage battery relay are controlled based on conditions using these charging rates and the like.

SUMMARY

However, in JP 2011-234479A, the lead storage battery is directly connected to the electrical load. Thus, it is difficult to directly detect its open-circuit voltage, and it is difficult to calculate its charging rate with high accuracy.

An exemplary aspect of the disclosure provides a charging rate monitoring apparatus for in-vehicle power supply capable of calculating the charging rates of both power storage devices with high accuracy.

A first aspect of a charging rate monitoring apparatus for in-vehicle power supply monitors charging rates of both a first power storage device and a second power storage device that supply power to a load via a power line. The charging rate monitoring apparatus includes a first switch, a second switch, a first monitoring circuit, and a second monitoring circuit. The first switch is connected between the power line and the first power storage device. The second switch is connected between the power line and the second power storage device. The first monitoring circuit outputs on/off signals to the first switch. The second monitoring circuit outputs on/off signals to the second switch. The first monitoring circuit executes a first process and a second process. In the first process, the first monitoring circuit turns off the first switch, detects a first open-circuit voltage of the first power storage device, and obtains a first charging rate based on the detected first open-circuit voltage and a relationship between the first open-circuit voltage and the first charging rate of the first power storage device. In the second process, the first monitoring circuit turns on the first switch, detects a first current flowing through the first power storage device, and updates the first charging rate based on the first current. The second monitoring circuit executes a third process and a fourth process. In the third step, the second monitoring circuit turns off the second switch, detects a second open-circuit voltage of the second power storage device, and obtains a second charging rate based on the detected second open-circuit voltage and a relationship between the second open-circuit voltage and the second charging rate of the second power storage device. In the fourth process, the second monitoring circuit turns on the second switch, detects a second current flowing through the second power storage device, and updates the second charging rate based on the second current.

A second aspect of the charging rate monitoring apparatus for in-vehicle power supply is the charging rate monitoring apparatus for in-vehicle power supply according to the first aspect, in which when the first open-circuit voltage is detected, the second monitoring circuit turns on the second switch.

A third aspect of the charging rate monitoring apparatus for in-vehicle power supply is the charging rate monitoring apparatus for in-vehicle power supply according to the second aspect, in which the second charging rate is input to the first monitoring circuit from the second monitoring circuit, and when the second charging rate is larger than a first reference value, the first monitoring circuit starts the first process.

A fourth aspect of the charging rate monitoring apparatus for in-vehicle power supply is the charging rate monitoring apparatus for in-vehicle power supply according to the third aspect, in which when the second charging rate falls below the first reference value in the first process, the first monitoring circuit suspends the first process and turns on the first switch.

A fifth aspect of the charging rate monitoring apparatus for in-vehicle power supply is the charging rate monitoring apparatus for in-vehicle power supply according to the third or fourth aspect, in which when the second charging rate is larger than the first reference value and the first charging rate is larger than a second reference value, the first monitoring circuit starts the first process.

A sixth aspect of the charging rate monitoring apparatus for in-vehicle power supply is the charging rate monitoring apparatus for in-vehicle power supply according to any one of the first to fifth aspects, in which the first monitoring circuit and the second monitoring circuit respectively control the first switch and the second switch such that both the first switch and the second switch are not turned off at least while the vehicle is moving.

A seventh aspect of the charging rate monitoring apparatus for in-vehicle power supply is the charging rate monitoring apparatus for in-vehicle power supply according to any one of the first to sixth aspects, in which the first power storage device is a lead battery, and when an engine of the vehicle is stopped, the first monitoring circuit does not execute the first process.

An eighth aspect of the charging rate monitoring apparatus for in-vehicle power supply is the charging rate monitoring apparatus for in-vehicle power supply according to the seventh aspect, in which the first switch is a normally closed switch.

A ninth aspect of the charging rate monitoring apparatus for in-vehicle power supply is the charging rate monitoring apparatus for in-vehicle power supply according to the seventh or eighth aspect, in which the second power storage device is a lithium ion battery or a nickel metal hydride battery, and the second switch is a normally open switch.

A tenth aspect of the charging rate monitoring apparatus for in-vehicle power supply is the charging rate monitoring apparatus for in-vehicle power supply according to any one of the first to ninth aspects, in which in the second process, the first monitoring circuit updates the first charging rate based on a value obtained by integrating the first current, and in the fourth process, the second monitoring circuit updates the second charging rate based on a value obtained by integrating the second current.

An aspect of an in-vehicle power supply system includes the charging rate monitoring apparatus for in-vehicle power supply according to any one of the first to tenth aspects, the first power storage device, and the second power storage device, in which the first power storage device and the first monitoring circuit are disposed in an engine room, and the second power storage device and the second monitoring circuit are disposed opposite to the engine room with respect to a vehicle interior.

According to the first to tenth aspects of the charging rate monitoring apparatus for in-vehicle power supply, the charging rates of both power storage devices can be calculated with high accuracy.

According to the second aspect of the charging rate monitoring apparatus for in-vehicle power supply, it is possible to execute the first process while causing the second power storage device to function as a power source.

According to the third aspect of the charging rate monitoring apparatus for in-vehicle power supply, it is possible to realize a stable supply of power to a vehicle load in the first process.

According to the fourth aspect of the charging rate monitoring apparatus for in-vehicle power supply, when the second charging rate of the second power storage device is low, the first power storage device can be connected to the power line.

According to the fifth aspect of the charging rate monitoring apparatus for in-vehicle power supply, the first charging rate of the first power storage device is high in the first process. Thus, when the second charging rate of the second power storage device decreases and the first process ends, the first power storage device having a high first charging rate can supply power to the power line.

According to the sixth aspect of the charging rate monitoring apparatus for in-vehicle power supply, at least one of the first power storage device and the second power storage device can supply power.

According to the seventh aspect of the charging rate monitoring apparatus for in-vehicle power supply, it is possible to keep the first switch on while the engine is stopped. Moreover, the first power storage device can supply a dark current. The first power storage device is a lead battery, and thus is suitable for the supply of a dark current.

According to the eighth aspect of the charging rate monitoring apparatus for in-vehicle power supply, it is possible to reduce power consumption.

According to the ninth aspect of the charging rate monitoring apparatus for in-vehicle power supply, it is possible to save the power of the second power storage device.

According to the aspect of the in-vehicle power supply system, it is possible to respectively connect the first monitoring circuit and the second monitoring circuit to the first power storage device and the second power storage device with short wires. Accordingly, it is possible to detect the open-circuit voltages of the first power storage device and the second power storage device with high accuracy.

DETAILED DESCRIPTION OF EMBODIMENTS

Configuration

Figure 1:
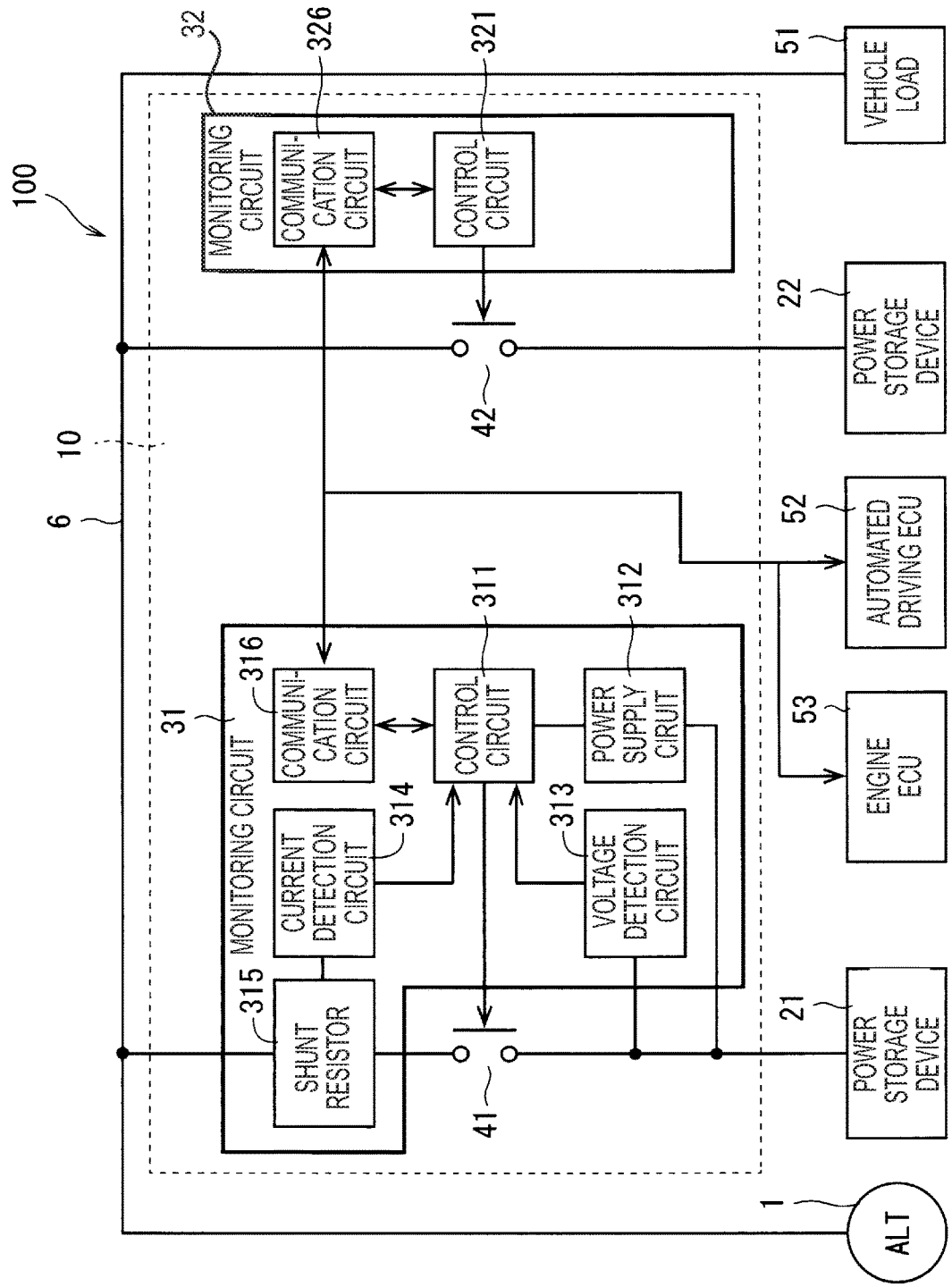
FIG. 1 is a block diagram that schematically shows one example of an in-vehicle power supply system.

FIG. 1 is a block diagram that schematically shows one example of the configuration of an in-vehicle power supply system 100. This in-vehicle power supply system 100 is installed in a vehicle. The in-vehicle power supply system 100 includes at least a charging rate monitoring apparatus 10 for in-vehicle power supply and power storage devices 21 and 22. As shown in FIG. 1, the in-vehicle power supply system 100 may also further include a generator 1, a vehicle load 51, an automated driving ECU (Electronic Control Unit) 52, and an engine ECU 53.

The generator 1 is an alternator, for example, and is denoted by "ALT" in the example shown in FIG. 1. For example, the generator 1 generates power as the engine rotates, and outputs a direct voltage. This generator 1 may also generate power during deceleration of the vehicle, for example. This makes it possible to effectively utilize energy associated with the deceleration of the vehicle. The generator 1 is connected to the power line 6, and can supply the generated power to the power line 6.

The power storage device 21 is a lead battery, for example. The power storage device 21 is connected to the power line 6 via a switch 41. The switch 41 is a relay, for example. When this switch 41 is turned on, the power storage device 21 is conductively connected to the generator 1 via the power line 6. By outputting a direct voltage that is higher than a terminal voltage of the power storage device 21, the generator 1 can charge the power storage device 21.

The power storage device 22 is a lithium ion battery or a nickel metal hydride battery, for example. The power storage device 22 is connected to the power line 6 via a switch 42. The switch 42 is a relay, for example. When this switch 42 is turned on, the power storage device 22 is conductively connected to the generator 1 via the power line 6. By outputting a direct voltage that is higher than a terminal voltage of the power storage device 22, the generator 1 can charge the power storage device 22.

The vehicle load 51 is connected to the power line 6. The vehicle load 51 is an electrical motor for power steering or an electrical motor for a brake, for example. Power is supplied to the vehicle load 51 by at least one of the generator 1 and the power storage devices 21 and 22.

The charging rate monitoring apparatus 10 for in-vehicle power supply monitors charging rates of both the power storage devices 21 and 22, and includes the above-described switches 41 and 42, and monitoring circuits 31 and 32. The monitoring circuit 31 outputs on/off signals to the switch 41, and monitors the state (more specifically, the charging rate)

of the power storage device 21. The monitoring circuit 32 outputs on/off signals to the switch 42, and monitors the state (more specifically, the charging rate) of the power storage device 22. The monitoring circuits 31 and 32 will be described in detail later.

An engine ECU 53 controls an engine provided in the vehicle. The engine generates the force of driving the vehicle. The engine ECU 53 controls an ignition system and a fuel system of the engine, for example. Also, in order to control the switches 41 and 42 in accordance with the state of the engine, for example, the engine ECU 53 may also transmit an instruction to the monitoring circuits 31 and 32.

The automated driving ECU 52 performs automated driving by controlling various loads (including the vehicle load 51) provided in the vehicle. This automated driving is driving for moving to a destination without a user operation or for parking in a desired orientation. The automated driving ECU 52 may also transmit instructions to the monitoring circuits 31 and 32 in order to control the on/off states of the switches 41 and 42 in an automated driving mode.

When receiving the instructions from the engine ECU 53 and the automated driving ECU 52, the monitoring circuits 31 and 32 respectively control the switches 41 and 42 based on these instructions.

Also, in order to monitor the states (specifically, the charging rates) of the power storage devices 21 and 22, the monitoring circuits 31 and 32 can respectively control the switches 41 and 42. Specifically, the monitoring circuit 31 turns off the switch 41, detects an open-circuit voltage Voc1 of the power storage device 21, and executes a first process for obtaining a charging rate Soc1 of the power storage device 21 based on this open-circuit voltage Voc1. Note that in order to distinguish between the actual charging rate Soc1 and the calculated charging rate Soc1, the calculated charging rate Soc1 is also referred to as "charging rate Soc11".

Figure 2:
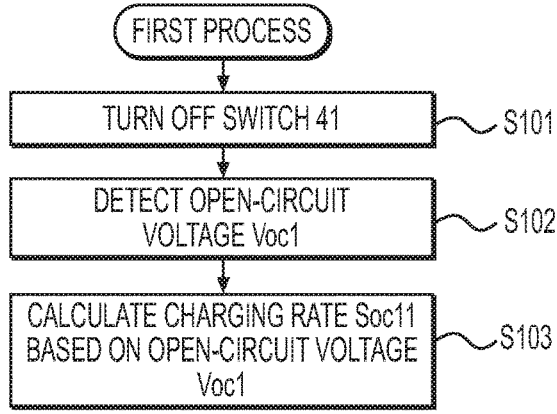
FIG. 2 is a flowchart showing one example of operations of a monitoring circuit.

FIG. 2 is a flowchart showing one example of operations of the first process. First, in step S101, the monitoring circuit 31 turns off the switch 41. At this time, the power storage device 21 is disconnected from the power line 6, and thus, it can be assumed that the terminal voltage of the power storage device 21 indicates the open-circuit voltage Voc1. In view of this, in step S102, the monitoring circuit 31 detects the terminal voltage of the power storage device 21 as the open-circuit voltage Voc1. Next, in step S103, the monitoring circuit 31 calculates the charging rate Soc11 based on the open-circuit voltage Voc1. A relationship between the open-circuit voltage Voc1 and the charging rate Soc1 may also be set in advance through simulation or experiment, for example. Because the relationship between the open-circuit voltage Voc1 and the charging rate Soc1 can be approximately accurately obtained in advance, according to the first process, the charging rate Soc11 can be obtained with high accuracy. That is, in the first process, the power storage device 21 is disconnected from the power line 6, and thus, it is not possible to cause the power storage device 21 to function as the power source of the vehicle load 51, but the accuracy of calculating the charging rate Soc11 is high.

Also, the monitoring circuit 31 turns on the switch 41, detects a current i1 flowing through the power storage device 21, and executes a second process for updating the charging rate Soc11 based on a value obtained by integrating the current i1 and the charging rate Soc11 in the first process. This second process is executed following the first process.

Figure 3:
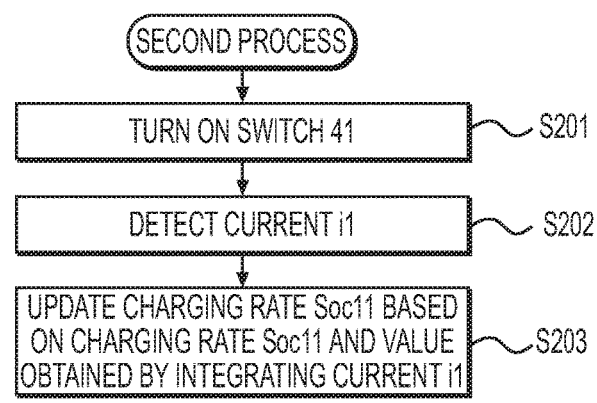
FIG. 3 is a flowchart showing one example of operations of a monitoring circuit.

FIG. 3 is a flowchart showing one example of operations of the second process. First, in step S201, the monitoring circuit 31 turns on the switch 41. Accordingly, the power storage device 21 is conductively connected to the power line 6, causing the power storage device 21 to function as one of the power sources of the vehicle load 51. Next, in step S202, the monitoring circuit 31 detects the current i1 flowing through the power storage device 21. Next, in step S203, the monitoring circuit 31 updates the charging rate Soc11 using a known technique, based on a value obtained by integrating the current i1 and the charging rate Soc11 calculated in the first process. According to the second process, it is possible to obtain the charging rate Soc11 while connecting the power storage device 21 to the power line 6. However, the accuracy of calculating the charging rate Soc11 is not high compared to that of the first process.

Figure 4:
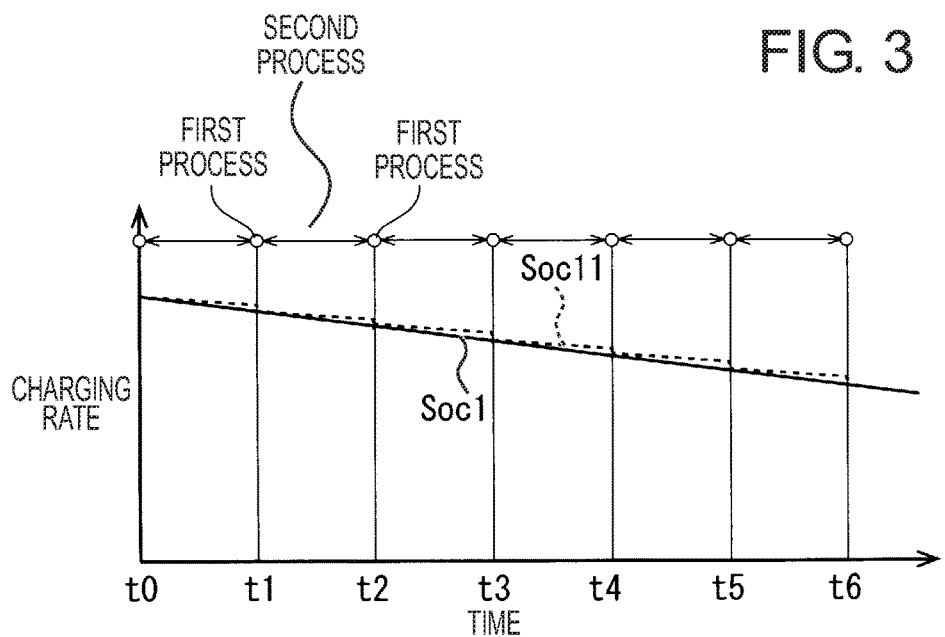
FIG. 4 is a graph that schematically shows one example of a charging rate.

The monitoring circuit 31 may also execute the above-described first process and second process in a repetitive manner. For example, every time the monitoring circuit 31 has executed the second process a plurality of times, the monitoring circuit 31 may also execute the first process. FIG. 4 is a graph that schematically shows examples of the charging rates Soc1 and Soc11 of the power storage device 21. FIG. 4 shows, as an example, a case where the actual charging rate Soc1 of the power storage device 21 decreases along with the lapse of time.

The monitoring circuit 31 repeatedly executes the second process from time t0 to time t1, and repeatedly updates the charging rate Soc11, for example. In the example shown in FIG. 4, in a period from time t0 to time t1, repetitive execution of the second process is indicated by depicting "second process" near both-ends arrows. During this period, the switch 41 can be turned on, and thus it is possible to cause the power storage device 22 to function as one of the power sources of the vehicle load 51. Meanwhile, an error tends to occur in the charging rate Soc1 in the second process, and thus errors accumulate every time the second process is executed. In the example shown in FIG. 4, during the period from time t0 to time t1, a difference (error) between the charging rates Soc1 and Soc11 increases with the lapse of time.

The monitoring circuit 31 executes the first process and calculates the charging rate Soc11 at time t1. In the example shown in FIG. 4, execution of the first process at time t1 is indicated by depicting "first process" corresponding to white circles. In the first process, because the switch 41 is turned off, the power storage device 21 is disconnected from the power line 6, but it is possible to calculate the charging rate Soc11 close to the actual charging rate Soc1. Thus, as shown in FIG. 4, an error between the charging rates Soc1 and Soc11 is small at time t1. The monitoring circuit 31 repeatedly executes the second process and repeatedly updates the charging rate Soc11 in the period from time t1 to time t2. That is, the monitoring circuit 31 updates the charging rate Soc11 based on the charging rate Soc11 at time t1 and the value obtained by integrating the current i1. Afterwards, the monitoring circuit 31 repeats similar operations.

As described above, although errors accumulate in the second process, it is possible to reduce these errors every time the first process is executed. Thus, the charging rate Soc11 can be calculated with greater accuracy compared to the case where the second process is executed without executing the first process. Similar effects can be obtained also if the actual charging rate Soc1 of the power storage device 21 increases with the lapse of time.

The monitoring circuit 32 also operates similarly to the monitoring circuit 31. That is, the monitoring circuit 32 turns off the switch 42, detects an open-circuit voltage Voc2 of the power storage device 22, and executes a third process for obtaining a charging rate Soc2 of the power storage device 22 based on this open-circuit voltage Voc2. Note that hereinafter, in order to distinguish between the actual charging rate Soc2 and the calculated charging rate Soc2, the calculated charging rate Soc2 is also referred to as "charging rate Soc21". A relationship between the open-circuit voltage Voc2 and the charging rate Soc2 may also be set in advance through simulation or experiment, for example. According to the third process, although the power storage device 22 is disconnected from the power line 6, it is possible to obtain the charging rate Soc21 with high accuracy.

Also, the monitoring circuit 32 turns on the switch 42, detects a current i2 flowing through the power storage device 22, and executes a fourth process for updating the charging rate Soc21 based on a value obtained by integrating the current i2 and the charging rate Soc21 in the third process. In the fourth process, it is possible to obtain the charging rate Soc21 while the power storage device 22 is functioning as the power source by turning on the switch 41. However, its calculation accuracy is lower than that of the third process.

The monitoring circuit 32 may also execute the third process and the fourth process in a repetitive manner. For example, every time the monitoring circuit 32 has executed the fourth process a plurality of times, the monitoring circuit 32 may also execute the third process. Although errors in the charging rate Soc21 accumulate every time the fourth process is executed, it is possible to reduce these errors every time the third process is executed.

As described above, the monitoring circuits 31 and 32 can respectively obtain the charging rate Soc11 of the power storage device 21 and the charging rate Soc21 of the power storage device 22 with high accuracy. Moreover, the monitoring circuits 31 and 32 can respectively cause the power storage devices 21 and 22 to function as the power sources of the vehicle load 51 in the second and fourth processes.

Incidentally, in a vehicle, the generator 1 generates only a small amount of power in some cases. For example, in a coasting mode, in order to prevent a regenerative brake from working, the generator 1 is sometimes not allowed to generate power. Also, in an automated driving mode, for example, when the automated driving ECU 52 parks the vehicle at a desired position in a desired orientation, the engine has a small rotational speed, and thus the generator 1 generates only a small amount of power. When the generator 1 generates a small amount of power, the power storage devices 21 and 22 supply power to the vehicle load 51. Thus, for example, under the condition that the charging rates Soc1 and Soc2 are sufficiently large, the execution of the above-described modes should be permitted. This is because the supply of power to the vehicle load 51 is maintained in each mode.

However, if the accuracy in calculating the charging rates Soc11 and Soc21 is low, although the actual charging rates Soc1 and Soc2 are small, sometimes they are calculated as large values. When each mode is adopted based on these calculated values, the charging rates Soc1 and Soc2 may become insufficient in these modes. From the viewpoint of a stable supply of power to the vehicle load 51 taking execution of the modes into consideration, such circumstances are not desirable.

According to the monitoring circuits 31 and 32, it is possible to calculate the charging rates Soc11 and Soc21 with high accuracy and to avoid the above-described circumstances.

Examples of Configurations of Monitoring Circuits 31 and 32

The internal configurations of the monitoring circuits 31 and 32 may be the same. For example, referring to FIG. 1, the monitoring circuit 31 includes a control circuit 311, a power supply circuit 312, a voltage detection circuit 313, a current detection circuit 314, and a communication circuit 316. For simplification of illustration, with regard to the monitoring circuit 32, only the control circuit 321 and the communication circuit 326 are shown in the example of FIG. 1.

The voltage detection circuit 313 detects the terminal voltage of the power storage device 21 near the power storage device 21 with respect to the switch 41 and outputs the detected terminal voltage to the control circuit 311. When the switch 41 is off, the terminal voltage of the power storage device 21 can be regarded as the open-circuit voltage Voc1.

The current detection circuit 314 detects the current i1 flowing through the power storage device 21, and outputs the detected current i1 to the control circuit 311. In the example shown in FIG. 1, a shunt resistor 315 is provided. The shunt resistor 315 is connected to the switch 41 in series between the power line 6 and the power storage device 21, for example. The current detection circuit 314 detects a voltage across both ends of the shunt resistor 315. A current (current i1) flowing through the shunt resistor 315 can be obtained based on the resistance of the shunt resistor 315 and the voltage across both ends of the shunt resistor 315.

The terminal voltage of the power storage device 21 is input to the power supply circuit 312. The power supply circuit 312 converts this voltage to a voltage that is suitable as the voltage for operating the control circuit 311, and outputs the converted voltage to the control circuit 311. The power supply circuit 312 is a switching regulator, for example.

The control circuit 311 turns the switch 41 on/off. Also, the control circuit 311 obtains the charging rate Soc11 by executing the above-described first process and second process.

Note that herein, the control circuit 311 is configured including a microcomputer and a storage device. The microcomputer executes processing steps (in other words, procedures) written in a program. The storage device can be configured by one or more of various storage devices such as a ROM (Read Only Memory), a RAM (Random Access Memory), a rewritable nonvolatile memory (EPROM (Erasable Programmable ROM) or the like), and a hard disk drive. This storage device stores various kinds of information, data, and the like, and stores programs executed by the microcomputer, and provides a working area for executing a program. Note that the microcomputer can be thought of as functioning as various means corresponding to each process step written in a program, or can be thought of as realizing various functions corresponding to the process steps. Moreover, the control circuit 311 is not limited thereto, and may also be realized by various procedures executed by the control circuit 311, or various means realized by the control circuit 311, or portions or all of the various functions may be realized by hardware. The same applies to the control circuit 321.

The control circuit 311 is communicable with the monitoring circuit 32 via the communication circuit 316. Specifically, the control circuits 311 and 321 mutually transmit and receive signals via the communication circuits 316 and 326. The monitoring circuits 31 and 32 may also communicate with each other and perform control such that the switches 41 and 42 are not turned off simultaneously at least while the vehicle is moving. The reason is as follows: if both the switches 41 and 42 are turned off, while the generator 1 does not generate power, the vehicle load 51 cannot receive power. Therefore, it is desirable that the first process in which the switch 41 is turned off and the third process in which the switch 42 is turned off are executed in different time periods. Note that "while the vehicle is moving" herein may also include not only a case where the vehicle is actually moving but also a case where the vehicle is stopped in a state in which its engine is operating. Specifically, a case where the vehicle is stopped temporarily may also be included in "while the vehicle is moving". That is, the above-described control may also be executed if the vehicle is stopped in a state in which the engine is operating. In short, the above-described control may also be executed if a shift lever is located at a position different from a so-called parking position. Information indicating the position of the shift lever is detected by a sensor as appropriate, and is input to the control circuits 311 and 321.

Figure 5:
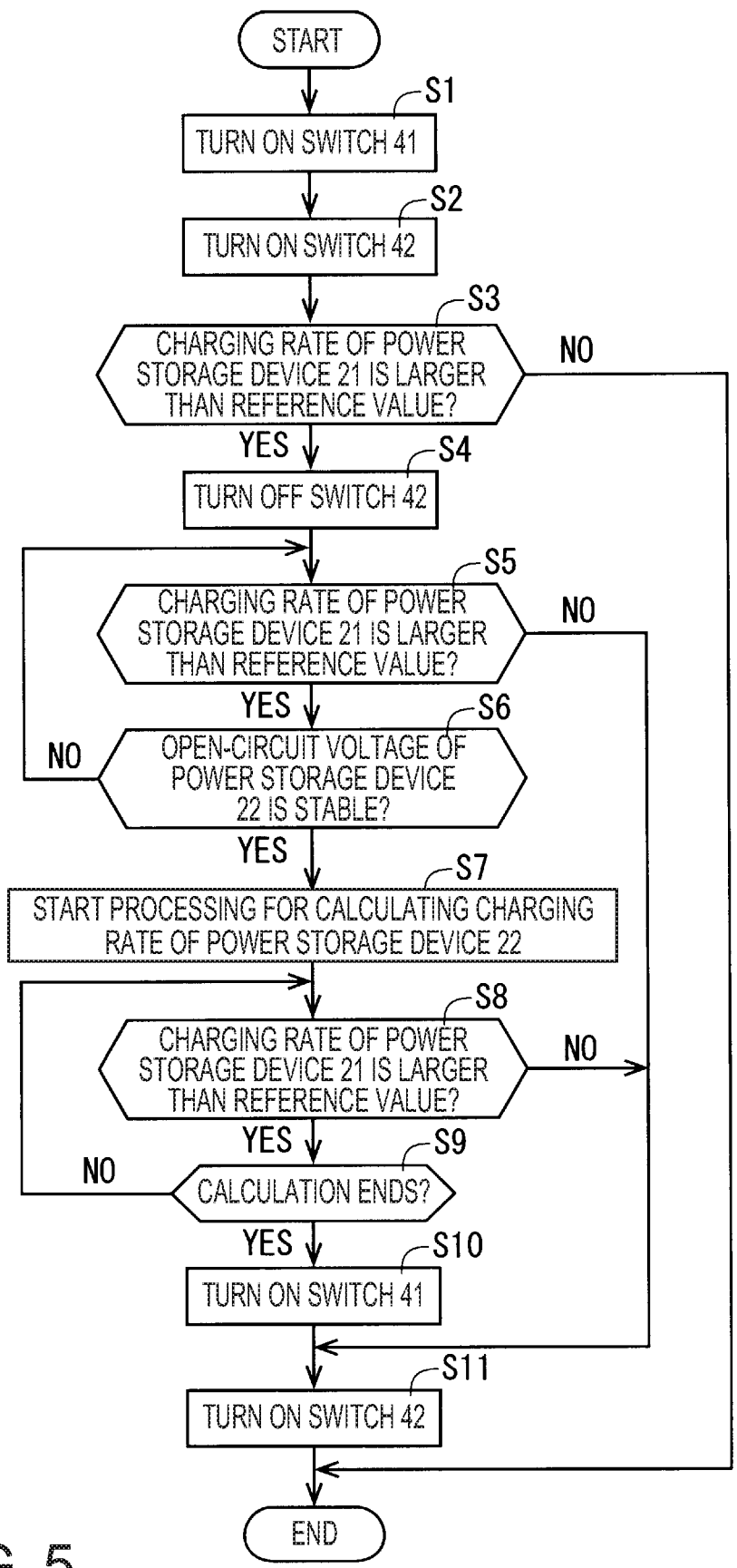
FIG. 5 is a flowchart showing one example of operations of a charging rate monitoring apparatus.

FIG. 5 is a flowchart showing one example of operations of a charging rate monitoring apparatus 10 for in-vehicle power supply. First, in step S1, the control circuit 311 turns on the switch 41. Next, in step S2, the control circuit 321 turns on the switch 42. Steps S1 and S2 may be executed in a reverse order, or may be executed simultaneously.

In step S3 subsequent to steps S1 and S2, the control circuit 321 determines whether or not the charging rate Soc11 of the power storage device 21 is larger than the reference value Sref1. The reference value Sref1 may also be set in advance, for example, and be stored in a predetermined storage medium. The reference value Sref1 is a value that is larger than a lower limit value of the charging rate Soc1 at which power can be supplied to e.g. the vehicle load 51. Note that the charging rate Soc11 is calculated by the control circuit 311 as described above, and the calculated charging rate is transmitted to the control circuit 321 every time the charging rate is calculated. That is, the charging rate Soc11 is input to the monitoring circuit 32 from the monitoring circuit 31.

When determining that the charging rate Soc11 is larger than the reference value Sref1, the control circuit 321 executes steps S4 to S11. These steps S4 to S11 represent examples of the operations of the third process performed by the control circuit 321. When determining that the charging rate Soc11 is smaller than the reference value Sref1, the control circuit 321 ends processing without execution of steps S4 to S11. That is, the control circuit 321 executes the third process only when the charging rate Soc11 of the power storage device 21 is larger than the reference value Sref1. This execution is caused by the following reasons. That is, in the third process, the switch 42 is turned off (step S4, which will be described later), and thus power cannot be supplied from the power storage device 22. Thus, if the power storage device 21 has an insufficient charging rate Soc1, a problem may arise in the supply of power to the vehicle load 51. In view of this, when the charging rate Soc11 is high, in other words, when the power storage device 21 can supply power to the vehicle load 51, the third process is executed. Moreover, by the control circuit 311 turning on the switch 41 during the execution of the third process, the third process is executed while the supply of power to the vehicle load 51 is stably maintained.

Note that the reference value Sref1 may not be close to the lower limit value of the charging rate Soc1 at which power can be supplied, and may be a value that is removed from the lower limit value to some extent. This makes it possible to more stably maintain the supply of power to the vehicle load 51.

In step S4, the control circuit 321 turns off the switch 42. Next, in step S5, again, the control circuit 321 determines whether or not the charging rate Soc11 is larger than the reference value Sref1. The timing at which step S3 is executed and the timing at which step S5 is executed are different from each other, and thus the charging rate Soc11 in step S5 may be different from the charging rate Soc11 in step S3.

When determining that the charging rate Soc11 is smaller than the reference value Sref1, in step S11, the control circuit 321 turns on the switch 42 and ends processing. That is, during the execution of the third process, when the charging rate Soc11 falls below the reference value Sref1, the control circuit 321 ends (suspends) the third process halfway, and enables the supply of power from the power storage device 22 via the power line 6.

When, in step S5, it is determined that the charging rate Soc11 is larger than the reference value Sref1, the control circuit 321 determines in step S6 whether or not the terminal voltage of the power storage device 22 that was detected by the voltage detection circuit 313 is stable. Note that because the switch 42 is off, the terminal voltage of the power storage device 22 can be regarded as the open-circuit voltage Voc2. Also, when fluctuations in the open-circuit voltage Voc2 are within a predetermined range, for example, the control circuit 321 determines that the open-circuit voltage Voc2 is stable. When determining that the open-circuit voltage Voc2 is not stable, the control circuit 321 executes step S5 again.

When determining that the open-circuit voltage Voc2 is stable, the control circuit 321 starts, in step S7, processing for obtaining the charging rate Soc21 based on the open-circuit voltage Voc2. In the example shown in FIG. 5, it is assumed that the charging rate Soc11 of the power storage device 21 is checked during calculation of this charging rate Soc21. Specifically, in step S8 subsequent to step S7, the control circuit 321 determines whether or not the charging rate Soc11 is larger than the reference value Sref1. When determining that the charging rate Soc11 is smaller than the reference value Sref1, the control circuit 321 executes step S11 and ends processing.

When, in step S8, it is determined that the charging rate Soc11 is larger than the reference value Sref1, the control circuit 321 determines in step S9 whether or not the calculation of the charging rate Soc21 has ended. When determining that the calculation has not ended, the control circuit 321 executes step S8. When determining that the calculation has ended, in step S10, the control circuit 321 instructs the control circuit 311 to turn on the switch 41, and the control circuit 311 turns on the switch 41 in response to this instruction. Note that because the control circuit 311 turns on the switch 41 in step S1, it is not necessary to execute step S10. Next, in step S11, the control circuit 321 turns on the switch 42.

As described above, when the charging rate Soc11 of the power storage device 21 is larger than the reference value, the charging rate monitoring apparatus 10 for in-vehicle power supply starts the third process in the state in which the switch 41 is on. Thus, it is possible to start the third process while ensuring the supply of power from the power storage device 21 to the vehicle load 51. Moreover, when the charging rate Soc11 of the power storage device 21 is smaller than the reference value, the third process ends halfway and the switch 42 is turned on. This makes it possible to conductively connect the power storage device 22 to the power line 6 and to cause the power storage device 22 to function as the power source.

Note that in the operations shown in FIG. 5, when the third process starts (step S4), there are cases where the charging rate Soc21 of the power storage device 22 is low.

Anticipating this, the reference value Sref1 should be set to be a large value in advance. Accordingly, even if the charging rate Soc11 falls below the reference value Sref1 during the third process, the power storage device 21 can supply power to the vehicle load 51. Moreover, when the charging rate Soc11 falls below the reference value Sref, if the third process is ended and the switch 42 is turned on, the power storage device 22 can be changed by the generator 1. Thus, by charging the power storage device 22, the power storage device 22 can be also effectively utilized as the power source.

One example of operations of the first process is also similar to that of FIG. 5. For example, in FIG. 5, "switch 42" in steps S4 and S11 should be read as "switch 41", "power storage device 21" in steps S3, S5, and S8 should be read as "power storage device 22", "power storage device 22" in steps S6 and S7 should be read as "power storage device 21", and "switch 41" in step S10 should be read as "switch 42".

Figure 6:
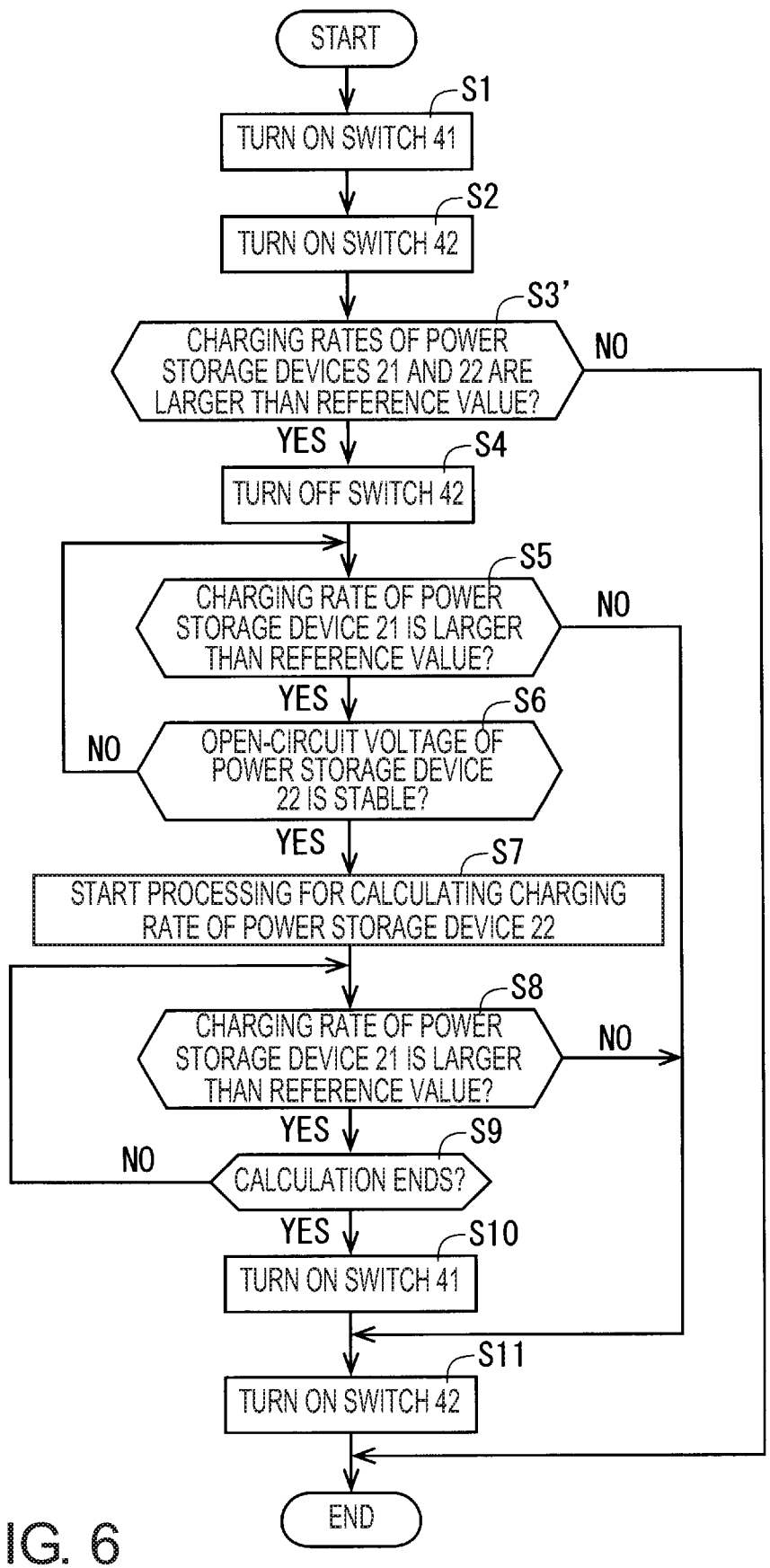
FIG. 6 is a flowchart showing another example of operations of a charging rate monitoring apparatus.

FIG. 6 is a flowchart showing another example of operations of the charging rate monitoring apparatus 10 for in-vehicle power supply. Compared to FIG. 5, the control circuit 321 executes step S3' instead of step S3. In step S3', the control circuit 321 determines whether or not both the charging rates Soc11 and Soc21 of the power storage devices 21 and 22 are larger than the reference value Sref1. When determining that at least one of the charging rates Soc11 and Soc21 is smaller than the reference value Sref1, the control circuit 321 ends processing without executing step S4 to S11. That is, the control circuit 321 does not execute the third process. On the other hand, when determining that both of the charging rates Soc11 and the Soc21 are larger than the reference value Sref1, the control circuit 321 executes steps S4 to S11.

As described above, unlike FIG. 5, the control circuit 321 starts the third process when not only the charging rate Soc11 of the power storage device 21 but also the charging rate Soc21 of the power storage device 22 are larger than the reference value Sref1. Therefore, even if the charging rate Soc11 of the power storage device 21 falls below the reference value Sref1 during the execution of the third process, the power storage device 22 having the charging rate Soc2 that is larger than the reference value Sref1 can supply power to the vehicle load 51 (steps S5, S8, and S11). This makes it possible to more stably maintain the supply of power to the vehicle load 51.

Note that in the example shown in FIG. 6, when it is determined in step S3' that the charging rates Soc11 and Soc21 of the power storage devices 21 and 22 are larger than the reference value Sref1, steps S4 to S11 are executed. When the charging rate Soc11 of the power storage device 21 is larger than the reference value Sref1 and the charging rate Soc21 of the power storage device 21 is larger than the reference value Sref2 that is different from the reference value Sref1, steps S4 to S11 may also be executed. This is because if the power storage devices 21 and 22 are of different types, the charge rates at which they can be used may differ.

Switch Mutual Monitoring

Figure 7:
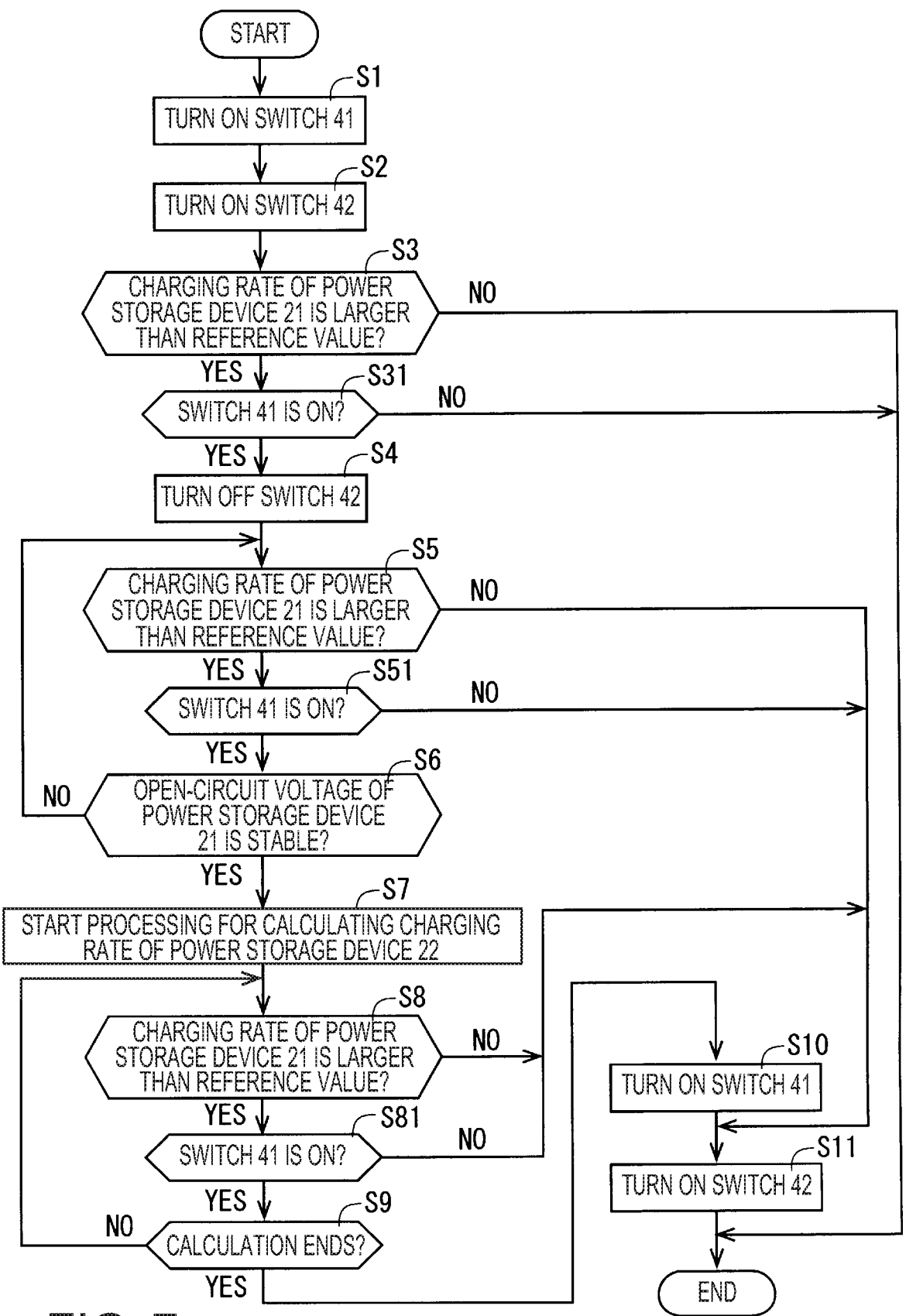
FIG. 7 is a flowchart showing another example of operations of a charging rate monitoring apparatus.

It can also be anticipated that the switch 41 is turned on by malfunction of the control circuit 311 or the control performed by another control circuit during calculation of the third process, for example. In view of this, the control circuits 311 and 321 may also monitor the states of each other's switches 41 and 42. FIG. 7 is a flowchart showing one example of the operations of the charging rate monitoring apparatus 10 for in-vehicle power supply. Compared to FIG. 5, the control circuit 321 further executes steps S31, S51, and S81.

Steps S31, S51, and S81 are respectively executed when in steps S3, S5, and S8, it is determined that the charging rate Soc11 of the power storage device 21 is larger than the reference value Sref1. In steps S31, S51, and S81, the control circuit 321 determines whether or not the switch 41 is on. For example, the control circuit 321 transmits, to the control circuit 311, a signal to request the state of the switch 41, and the control circuit 311 transmits the state of the switch 41 to the control circuit 321 in response to this signal. The state of the switch 41 can be determined by checking a control signal that is provided by the control circuit 311 to the switch 41, for example.

When, in step S31, it is determined that the switch 41 is off, the control circuit 321 ends the processing without performing the third process. That is, if the switch 41 is turned off in the third process in a state in which the switch 41 is off, the power storage devices 21 and 22 cannot supply power, and thus, such a situation is avoided. On the other hand, when, in step S31, it is determined that the switch 41 is on, the control circuit 321 executes step S4.

When, in steps S51 and S81, it is determined that the switch 41 is off, the control circuit 321 turns on the switch 42 in step S11, and then ends processing. That is, when the switch 41 is turned off during the execution of the third process, the control circuit 321 ends the third process halfway and turns on the switch 42, and thereby the power storage device 22 supplies power to the vehicle load 51.

When, in step S51, it is determined that the switch 41 is on, the control circuit 321 executes step S6, and when, in step S81, it is determined that the switch 41 is on, the control circuit 321 executes step S9.

Stopped Engine

When the engine of the vehicle is stopped, the switches 41 and 42 may also be controlled as follows while the vehicle is parked, for example. That is, the control circuit 321 may also turn off the switch 42, and the control circuit 311 may also turn on the switch 41. This makes it possible to supply power to the vehicle load 51 from the power storage device 21 instead of the power storage device 22. That is, a dark current can be supplied from the power storage device 21. This is particularly suitable when the power storage device 21 is a lead battery. Because the cost of the lead battery is low, the capacity of the lead battery can be easily increased, and the lead battery is suitable for a dark current when the vehicle is parked for a long period of time.

In this viewpoint, it is desired to avoid the execution of the first process in which the switch 41 is turned off, when the engine is stopped. In other words, it is desirable that the control circuit 311 prohibits the first process when the engine is stopped. Accordingly, the power storage device 21, which is the lead battery, can supply a dark current.

Figure 8:
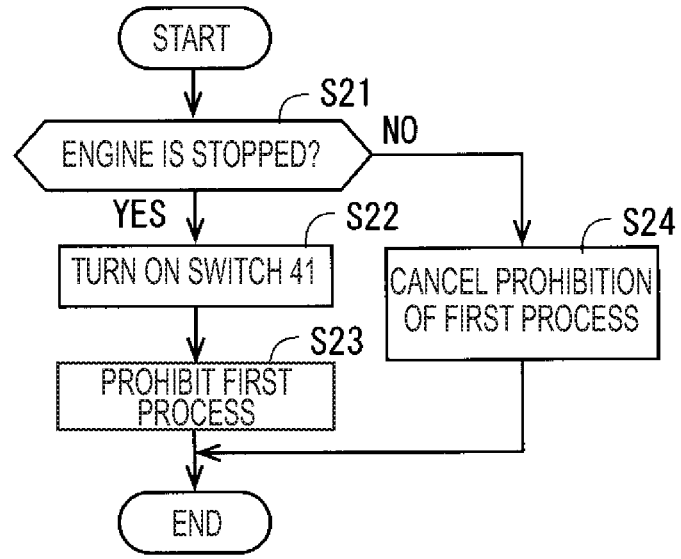
FIG. 8 is a flowchart showing one example of operations of a monitoring circuit.

FIG. 8 is a flowchart showing one example of operations of the monitoring circuit 31. The processing shown in FIG. 8 is executed in a predetermined period, for example. The control circuit 311 determines in step S21 whether the engine of the vehicle is stopped. For example, by receiving a notification from the engine ECU 53, the control circuit 311 determines whether or not the engine is stopped. When determining that the engine is stopped, in step S22, the control circuit 311 turns on the switch 41. Next, in step S23, the control circuit 311 prohibits the first process. Note that steps S22 and S23 may be executed in a reverse order.

When, in step S21, it is determined that the engine is not stopped, in step S24, the control circuit 311 cancels the prohibition of the first process. Accordingly, the control circuit 311 can execute the first process while the vehicle is moving, for example.

On the other hand, when the engine is stopped, the control circuit 321 turns off the switch 42. This makes it possible to save the power of the power storage device 22 while the engine is stopped and to suppress a decrease in the lifetime of the power storage device 22. The control circuit 321 may also perform the third process when the engine is stopped. The reason is as follows: because the switch 41 is on and the switch 42 is off, it is possible to calculate the charging rate Soc21 based on the open-circuit voltage Voc2 while maintaining the supply of power by the power storage device 21.

Figure 9:
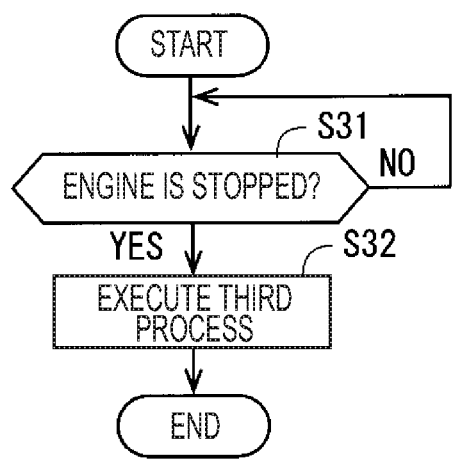
FIG. 9 is a flowchart showing another example of operations of a monitoring circuit.

FIG. 9 is a flowchart showing one example of operations of the monitoring circuit 32. The control circuit 321 determines in step S31 whether the engine of the vehicle is stopped. For example, by receiving a notification from the engine ECU 53, the control circuit 321 determines whether or not the engine is stopped. When determining that the engine is stopped, in step S32, the control circuit 321 executes the third process. That is, the control circuit 321 turns off the switch 42 and executes calculation of the charging rate Soc2 based on the open-circuit voltage Voc2.

Switch 41

The switch 41 may also be a normally closed switch. When the engine is stopped, the control circuit 311 may not output a control signal to the switch 41. In this case, while the engine is stopped, the switch 41 is turned on. Accordingly, the power storage device 21 can supply a dark current. Also, because it is not necessary to output the control signal to the switch 41, it is possible to reduce power consumption.

Switch 42

The switch 42 may also be a normally open switch. When the engine is stopped, the control circuit 321 may not output a control signal to the switch 42. In this case, when the engine is stopped, the switch 42 is turned off. This makes it possible to save the power of the power storage device 22 while the engine is stopped.

Figure 10:
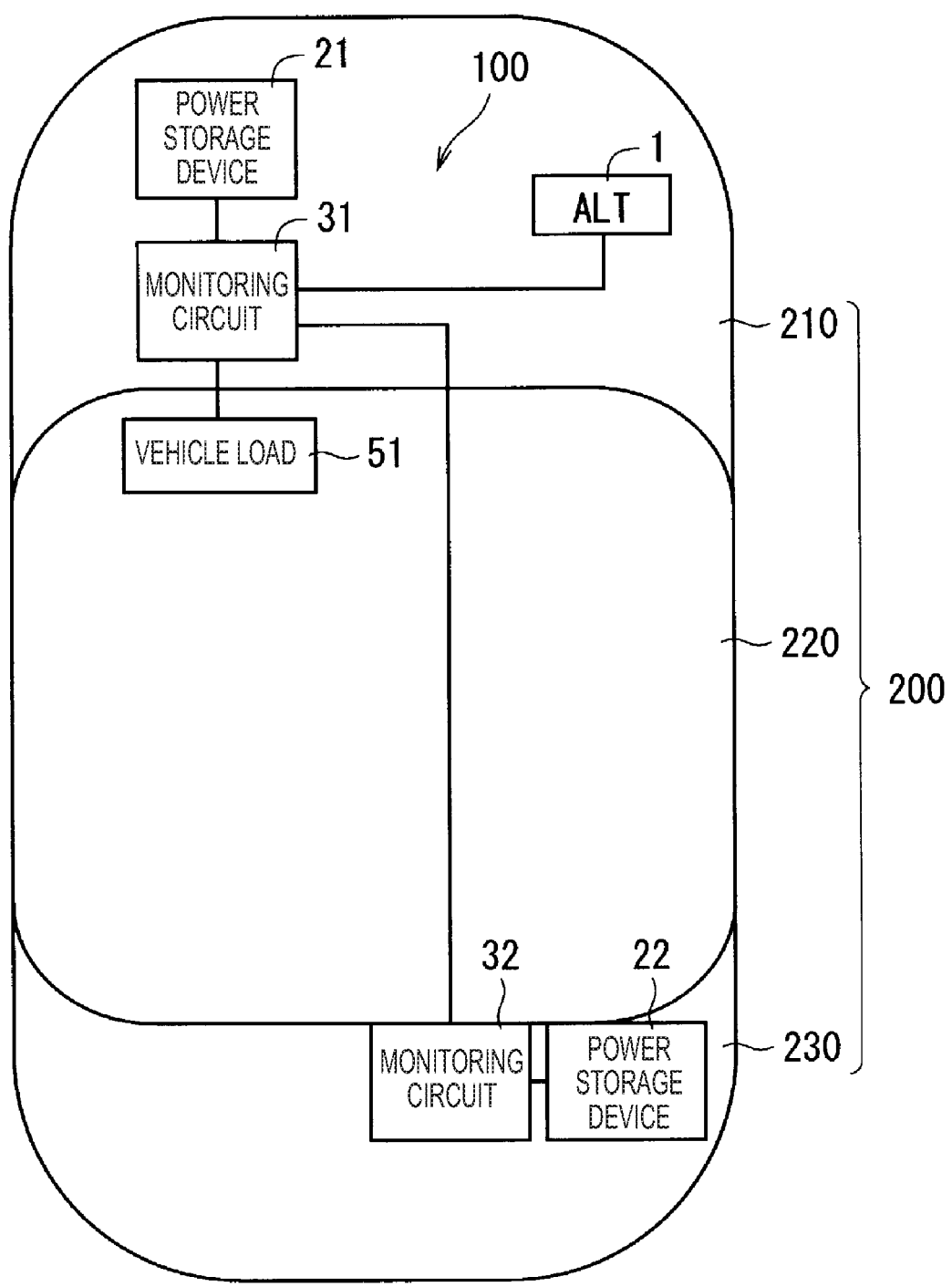
FIG. 10 is a block diagram that schematically shows one example of an in-vehicle power supply system.

FIG. 10 is a block diagram showing one example of a configuration of the in-vehicle power supply system 100. In the example shown in FIG. 10, the in-vehicle power supply system 100 is installed in a vehicle 200. The vehicle 200 is provided with an engine room 210, a vehicle interior 220, and a luggage room 230, for example. The luggage room 230 is provided opposite to the engine room 210 with respect to the vehicle interior 220. The engine room 210 is provided frontward in a direction in which the vehicle 200 moves, for example.

In the example shown in FIG. 10, the power storage device 21, the monitoring circuit 31, and the generator 1 are disposed in the engine room 210. Also, the power storage device 22 and the monitoring circuit 32 are disposed on the side of the luggage room 230. This makes it possible to respectively dispose the monitoring circuits 31 and 32 in the vicinity of the power storage devices 21 and 22. That is, the monitoring circuit 31 can be connected to the power storage device 21 using a short wire, and the monitoring circuit 32 can be connected to the power storage device 22 using a short wire. Accordingly, the monitoring circuits 31 and 32 can respectively detect the open-circuit voltages Voc1 and Voc2 of the power storage devices 21 and 22 with high accuracy, and thus can calculate the charging rates Soc11 and Soc21 with high accuracy.

Note that when the charging rates Soc11 and Soc12 exceed the upper limit value or fall below the lower limit value, the monitoring circuits 31 and 32 may also respectively turn off the switches 41 and 42. This makes it possible to suppress overcharging and overdischarging. Also, when an abnormality occurs on the power storage devices 21 and 22, for example, the monitoring circuits 31 and 32 may also respectively turn off the switches 41 and 42. This makes it possible to disconnect the power storage devices 21 and 22 on which an abnormality occurs from the power line 6.

The configurations described in the above-described embodiments and modifications can be used in combination as appropriate as long as they are consistent with each other.

Although this disclosure has been described in detail above, the above description is illustrative in all respects, and this disclosure is not limited to the above description. It will be understood that numerous modifications not illustrated here can be envisioned without departing from the scope of this disclosure.

The invention claimed is:

1. A charging rate monitoring apparatus for in-vehicle power supply configured to monitor charging rates of both a first power storage device and a second power storage device that supply power to a load via a power line, the apparatus comprising:
    a first switch connected between the power line and the first power storage device;
    a second switch connected between the power line and the second power storage device;
    a first monitoring circuit configured to output on/off signals to the first switch; and
    a second monitoring circuit configured to output on/off signals to the second switch,
    wherein the first monitoring circuit is configured to execute:
        a first process in which a terminal voltage of the first power storage device when the first switch is off is detected as a first open-circuit voltage, and a first charging rate is obtained based on the detected first open-circuit voltage and a relationship between the first open-circuit voltage and the first charging rate of the first power storage device, and
        a second process in which a first current flowing through the first power storage device is detected when the first switch is on, and the first charging rate is updated based on the first current,
    wherein the second monitoring circuit is configured to execute:
        a third process in which a terminal voltage of the second power storage device when the second switch is off is detected as a second open-circuit voltage, and a second charging rate is obtained based on the detected second open-circuit voltage and a relationship between the second open-circuit voltage and the second charging rate of the second power storage device, and
        a fourth process in which a second current flowing through the second power storage device is detected when the second switch is on, and the second charging rate is updated based on the second current.

2. The charging rate monitoring apparatus for in-vehicle power supply according to claim 1,
    wherein when the first open-circuit voltage is detected, the second monitoring circuit turns on the second switch.

3. The charging rate monitoring apparatus for in-vehicle power supply according to claim 2,
    wherein the second charging rate is input to the first monitoring circuit from the second monitoring circuit, and when the second charging rate is larger than a first reference value, the first monitoring circuit starts the first process.

4. The charging rate monitoring apparatus for in-vehicle power supply according to claim 3,
wherein when the second charging rate falls below the first reference value during the first process, the first monitoring circuit suspends the first process and turns on the first switch.

5. The charging rate monitoring apparatus for in-vehicle power supply according to claim 3,
wherein when the second charging rate is larger than the first reference value and the first charging rate is larger than a second reference value, the first monitoring circuit starts the first process.

6. The charging rate monitoring apparatus for in-vehicle power supply according to claim 1,
wherein the first monitoring circuit and the second monitoring circuit respectively control the first switch and the second switch such that both the first switch and the second switch are not turned off at least while the vehicle is moving.

7. The charging rate monitoring apparatus for in-vehicle power supply according to claim 1,
wherein the first power storage device is a lead battery, and
when an engine of the vehicle is stopped, the first monitoring circuit does not execute the first process.

8. The charging rate monitoring apparatus for in-vehicle power supply according to claim 7,
wherein the first switch is a normally closed switch.

9. The charging rate monitoring apparatus for in-vehicle power supply according to claim 7,
wherein the second power storage device is a lithium ion battery or a nickel metal hydride battery, and
the second switch is a normally open switch.

10. The charging rate monitoring apparatus for in-vehicle power supply according to claim 1,
wherein in the second process, the first monitoring circuit updates the first charging rate based on a value obtained by integrating the first current, and
in the fourth process, the second monitoring circuit updates the second charging rate based on a value obtained by integrating the second current.

11. An in-vehicle power supply system comprising:
the charging rate monitoring apparatus for in-vehicle power supply according to claim 1:
the first power storage device; and
the second power storage device,
wherein the first power storage device and the first monitoring circuit are disposed in an engine room, and
the second power storage device and the second monitoring circuit are disposed opposite to the engine room with respect to a vehicle interior.

* * * * *